(12) United States Patent
Hsu et al.

(10) Patent No.: US 7,394,283 B2
(45) Date of Patent: Jul. 1, 2008

(54) CML TO CMOS SIGNAL CONVERTER

(75) Inventors: Louis L. Hsu, Fishkill, NY (US); Gautam Gangasani, Hopewell Junction, NY (US); Michael A. Sorna, Hopewell Junction, NY (US); Steven J. Zier, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 53 days.

(21) Appl. No.: 11/467,349

(22) Filed: Aug. 25, 2006

(65) Prior Publication Data

US 2008/0061825 A1    Mar. 13, 2008

(51) Int. Cl.
*H03K 17/16* (2006.01)
(52) U.S. Cl. .............................. 326/32; 326/83; 326/115; 326/127; 327/108; 327/109
(58) Field of Classification Search .................... 326/32, 326/86, 115, 127; 327/108
See application file for complete search history.

(56) References Cited

U.S. PATENT DOCUMENTS

| | | | |
|---|---|---|---|
| 5,920,217 A | 7/1999 | Mellot | |
| 6,369,621 B1 * | 4/2002 | Tinsley et al. | 327/108 |
| 6,426,660 B1 | 7/2002 | Ho et al. | |
| 6,559,685 B2 | 5/2003 | Green | |
| 6,590,422 B1 * | 7/2003 | Dillon | 326/86 |
| 6,653,890 B2 | 11/2003 | Ono et al. | |
| 7,145,359 B2 * | 12/2006 | Hein et al. | 326/38 |

\* cited by examiner

*Primary Examiner*—Vibol Tan
(74) *Attorney, Agent, or Firm*—Steven Capella

(57) ABSTRACT

A signal regenerator is provided which includes a common mode reference generator and a signal converter circuit. A common mode reference voltage level is generated which is variable in relation to at least one of a process used to fabricate the common mode reference generator, a level of a power supply voltage provided to the common mode reference generator or a temperature at which the common mode reference generator is operated. A signal converter circuit receives a differentially transmitted signal pair including a first input signal and a second input signal and outputs a single-ended output signal representing information carried by the differentially transmitted signal pair. Using a feedback signal from the common mode reference generator, a feedback control block controls a common mode level of the single-ended output signal in accordance with the common mode reference voltage level.

7 Claims, 4 Drawing Sheets

CML TO CMOS SIGNAL CONVERTER

BACKGROUND OF THE INVENTION

The present invention relates to microelectronic circuits, especially those which are capable of converting signals from one signaling protocol, e.g., from a pair of differentially transmitted signals, to another signaling protocol, such as a signaling protocol in which one or more single-ended signals are transmitted.

Microelectronic circuits of various types of required to convert certain signals that are transmitted in accordance with one signaling protocol into different signals that correspond to a different signaling protocol. The process of converting from one signaling protocol to another can be problematic, particularly when the change involves more than merely shifting the voltage levels of the signals between one voltage to another. Some signaling protocols produce single-ended CMOS logic or TTL logic-type signals which have rail-to-rail signal swings which are readily usable by complementary metal oxide semiconductor ("CMOS") logic circuits or transistor-transistor-logic ("TTL"). However, such single-ended rail-to-rail signals are not well adapted for transmitting high switching rate signals and/or transmitting signals within noisy environments.

On the other hand, signaling protocols which transmit signals via a pair of complementary non-return-to-zero ("NRZ") differential signals are well adapted for transmitting high switching rate signals through noisy environments, and for doing so while consuming less power than that needed by other signaling protocols to achieve a comparable signal-to-noise ratio. Differential signaling protocols are being used increasingly in high-speed serializer-deserializer circuits, for example, for transmitting signals from one semiconductor device chip which houses an integrated circuit to another such semiconductor device chip. One such differential signaling protocol is known as current mode logic ("CML"). In the current mode logic protocol, an information signal is transmitted on a pair of wires as a pair of reduced signal swing NRZ differential signals. As an example, the differential signals swing between opposite high and low signal levels which have voltage levels that are usually only a few tens of millivolts to a few hundred millivolts apart. For instance, in one example, when a first one of the two differential signals is at a high level of 800 mV, the second one of the two differential signals can be at a low level of 400 mV. The difference between the high and low levels at a receiving circuit can be even smaller, such as about 50 mV and 100 mV, resulting in a peak-to-peak signal swing of 100 to 200 mV.

When the information carried by the two differential signals changes, the two signals swing between their respective levels to the opposite levels so that the first differential signal is at the low level and the second differential signal is at the high level. The two differentially transmitted current mode logic signals are received and converted to a single-ended signaling protocol by applying the two signals to circuits such as inverter circuits which amplify a difference (voltage and/or current) between them and outputting a single-ended output signal.

However, heretofore, many difficulties remain unaddressed in the performance of this signal conversion process. One key problem has been converting differential signals in such manner to produce rail-to-rail signals that have duty cycles compatible with the circuits that consume the signals. When the consuming circuits operate at their best with rail-to-rail signals having a 50% duty cycle, signals having noticeably asymmetric duty cycles, e.g., 55%-45%, 65%-35% or worse, can lead to high bit error rates, or require the transmission rate of the data carried thereby to be lowered. U.S. Pat. No. 6,559,685 to Green ("the Green Patent") and U.S. Pat. No. 5,920,217 to Mellot ("the Mellot Patent") illustrate examples of signal converter circuits that fail to achieve 50% duty cycles.

On the other hand, U.S. Pat. No. 6,426,660 to Ho et al. ("the Ho et al. Patent") describes a circuit designed to convert a clock signal from one frequency to another and achieve a 50% duty cycle. However, the circuitry applied to the task is cumbersome, requires a relatively large area of a semiconductor chip to implement and consumes much power.

SUMMARY OF THE INVENTION

Accordingly, in view of the aforementioned unresolved difficulties of the prior art, and in view of certain preferred embodiments of the invention described below, a signal regenerator is provided in accordance with an embodiment of the invention. Such signal regenerator includes a common mode reference generator and a signal converter circuit. The common mode reference generator is operable to generate a common mode reference voltage level which varies in relation to at least one of a process used to fabricate the common mode reference generator, a level of a power supply voltage provided to the common mode reference generator or a temperature at which the common mode reference generator is operated. A signal converter circuit having an input stage is operable to receive a differentially transmitted signal pair including a first input signal and a second input signal, an output stage operable to output a single-ended output signal representing information carried by the differentially transmitted signal pair, and a feedback control circuit operable to control a common mode level of the single-ended output signal in accordance with the common mode reference voltage level using a feedback signal from the common mode reference generator.

In addition, a method is provided for converting a differentially transmitted signal to a single-ended rail-to-rail output signal. In such method, a common mode reference voltage level is generated, having a level which is variable in relation to at least one of a process used to fabricate the common mode reference generator, a level of a power supply voltage provided to the common mode reference generator or a temperature at which the common mode reference generator is operated. In such method, a differentially transmitted signal pair is received including a first input signal and a second input signal. A single-ended output signal is output which represents information carried by the differentially transmitted signal pair. A common mode level of the single-ended output signal is controlled in accordance with the common mode reference voltage level.

DETAILED DESCRIPTION

Figure 1:
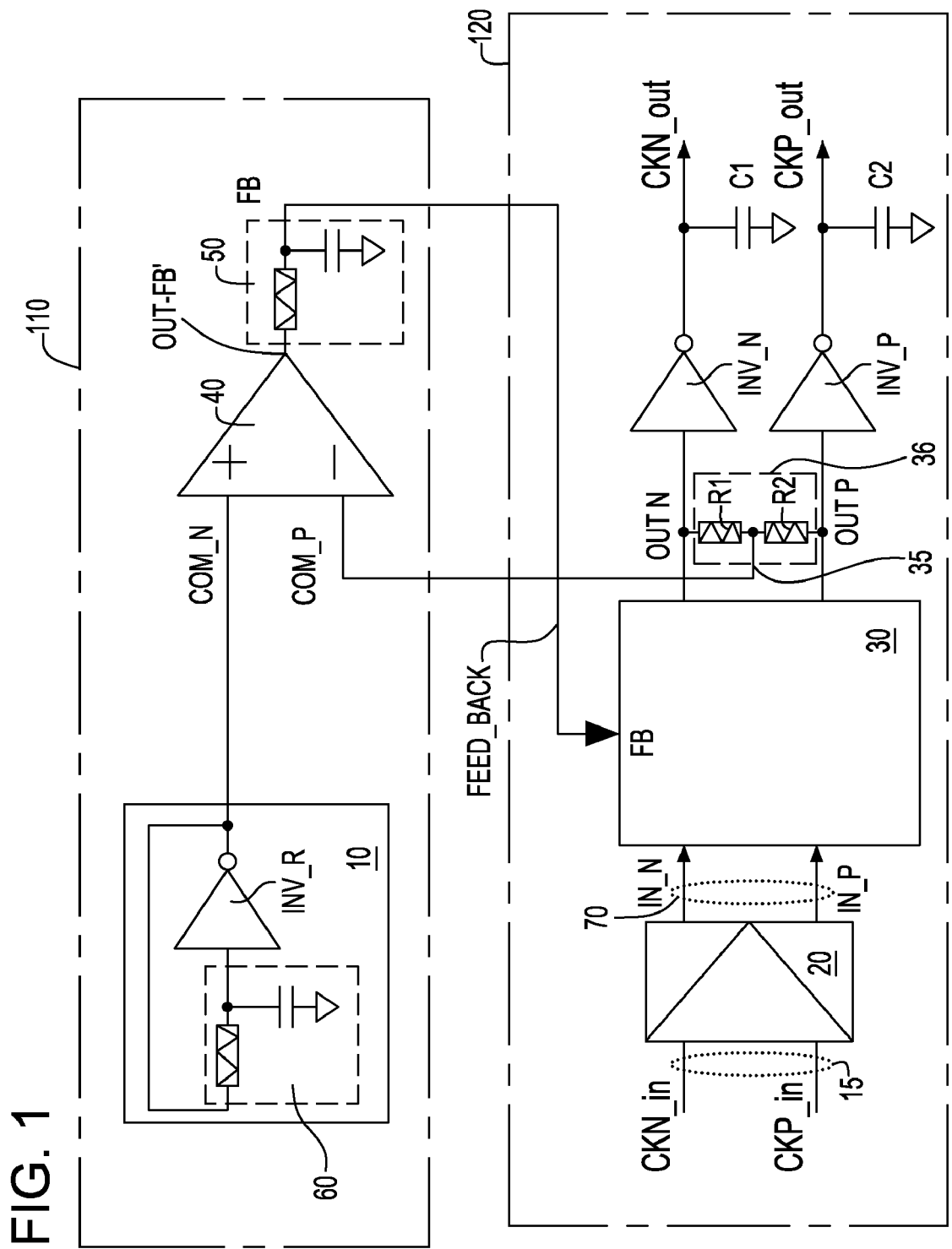
FIG. 1 is a block and schematic diagram illustrating a clock signal converter in accordance with one embodiment of the invention.

FIG. 1 is a block and schematic diagram of a signal regenerator 100, preferably employed as a clock converter circuit, in accordance with an embodiment of the invention. Using such circuit, a differentially transmitted non-return-to-zero ("NRZ") clock signal, transmitted as the signal pair CKN_in and CKP_in, is converted into a single-ended rail-to-rail logic signal CKN_out. The circuit also outputs a second single-ended rail-to-rail logic signal CKP_out, which is complementary to CKN_out. In a particular preferred embodiment, the differentially transmitted signals are transmitted in accordance with a current mode logic ("CML") signaling protocol, and the rail-to-rail logic signals are CMOS logic signals. However, the differentially transmitted signals need not be in accordance with CML signaling protocol, as other differential signaling protocols are available, and the rail-to-rail logic signals outputted by the signal regenerator 100 can be in accordance with other rail-to-rail signaling protocols such as TTL, for example.

In the particular example illustrated in FIG. 1, the differentially transmitted signals CKN_in and CKP_in together form a differential clock signal 15 that is input to a signal converter portion 120 of the signal regenerator 100. The differential clock signal 15 can be received at the signal regenerator 100 from a local clock generator located near the signal regenerator. Alternatively, the differential clock signal 15 is received from another region of a semiconductor device chip on which the signal regenerator 100 is provided, in which case the signal regenerator functions as a local clock converter for the region of the semiconductor chip in which it is located. None of these examples is intended to restrict the differential clock signal 15 to being generated by other circuitry of the same semiconductor chip on which the signal regenerator 100 is implemented or even restrict it to being transmitted to the input stage over wiring entirely within the same semiconductor chip.

The differential clock signal 15 preferably is a high switching rate clock signal, which is preferably transmitted from one region of a semiconductor device chip to other regions of the chip as a differential NRZ clock signal using a CML signaling protocol. Such CML NRZ differential signal includes two signals which simultaneously swing between opposite levels. The signal swing of the differential clock signal preferably is relatively small. As an example, each of the signals that make up the CML differential signal pair 15 can swing between a low signal level of about 300 to 600 millivolts (mV) and a high signal level of about 400 to 1100 mV, to produce a peak-to-peak signal swing of from about 100 mV to about 1000 mV. Differential signal transmission improves signal-to-noise ratio and a modest or relatively small signal swing helps to conserve power as the high switching rate clock signal is transmitted from the one region of the semiconductor device chip to another.

The functions of the various parts of the signal regenerator circuit 100 are as follows. The signal regenerator includes two main portions, a common mode reference generator portion 110 and a signal converter portion 120. The common mode reference generator is operable to generate a common mode reference voltage level COM_N which is applied to the positive input of a high-gain differential amplifier 40 such as an operational amplifier. The differential amplifier has high gain, e.g., a gain of about 500 to 1000. Due to the high gain of the differential amplifier 40, the voltage COM_P at the negative input of the differential amplifier 40 is maintained at about the same level as the common mode reference level COM_N. The high gain of the differential amplifier 40 limits the DC offset voltage between the COM_N and COM_P voltages at the positive and negative inputs of the differential amplifier to about 0.1 millivolts or less. In this way, the common mode reference generator produces a common mode reference voltage level COM_P whose level is established through the generation of the voltage level COM_N.

The common mode reference voltage level COM_P is applied to an intermediate node 35 of a voltage divider 36, between resistances R1 and R2, the resistances preferably having equal values. The voltage divider 36 is connected between signal lines carrying the rail-to-rail signals OUT_N and OUT_P generated from the input differential signal. In this way, the voltage level of COM_P applied to node 35 controls the common mode voltage level of the two rail-to-rail signals OUT_N and OUT_P. When the resistances R1 and R2 have equal values, the common mode voltage level remains at a voltage halfway between the voltages of the two rail-to-rail signals. A feedback signal FB, generated by the differential amplifier 40, is provided to a feedback control block 30 of the signal converter circuit 120 and is used to maintain the COM_N and COM_P voltages at the same value. A low-pass filter 50 at the output of the differential amplifier acts to reduce oscillation in the feedback loop through differential amplifier 40.

A shunted inverter circuit 10 is operable to generate the common mode reference voltage level COM_N in the first instance. The shunted inverter 10 preferably includes an inverter INV_R having an output connected in a feedback loop to its input through a low-pass filter 60, the low-pass filter functioning to reduce oscillation in the feedback loop. Preferably, the phase margin of the differential amplifier is maintained between 65 degrees and 82 degrees to assure that the feedback loop remains stable. Preferably, the inverter INV_R is implemented by CMOS circuitry, such as by stacked transistors including an NFET (n-type conduction channel field effect transistor) stacked with a PFET (a p-type conduction channel field effect transistor) between a power supply voltage (which serves as an upper rail voltage) and ground (which serves as a lower rail voltage).

The common mode reference voltage level COM_N produced by the shunted inverter 10 has a level equal to the quiescent point of the CMOS inverter INV_R. Preferably, by operation of the CMOS inverter, the quiescent point is equal to the half the difference between the upper rail voltage level and the lower rail voltage level. Preferably, the upper rail voltage level is equal to a power supply voltage level Vdd supplied to the inverter, and the lower rail voltage level preferably coincides with ground, such that the quiescent point in such case is equal to ½ Vdd. As a result, COM_N has a voltage level equal to ½ Vdd. COM_N is also preferably maintained at a voltage halfway between the final upper rail voltage Vdd of the final single-ended output signal CKN_out and the lower rail voltage, which is ground.

The common mode reference voltage level COM_N serves as a reference voltage level to set the switching point of two rail-to-rail output inverters INV_N and INV_P in the signal converter portion of the circuit. A high gain differential amplifier 40, to which COM_N is supplied as one input, operates in a closed feedback loop to maintain the voltage COM_P at a second input at the same or essentially the same level. The voltage COM_P is referenced to a node 35 between resistances R1 and R2 of a voltage divider 36. When the resistances R1 and R2 are equal in value, the common mode reference voltage level COM_P at node 35 in the output stage maintains the switching point of the output inverters INV_N and INV_P at ½ Vdd. In this way, each of the rail-to-rail signals CKN_out and CKP_out produced by the output inverters INV_N and INV_P travels between a lower rail voltage of ground and an upper rail voltage of Vdd and has a duty cycle of 50%.

Use of a shunted inverter 10 to produce a common mode reference voltage level provided to the output stage of the signal converter portion 120 is advantageous for the following reason. It is known that the fabrication process of a semiconductor device wafer can vary spatially, i.e., be different from one location of the wafer to another. After the semiconductor device wafer is diced into individual semiconductor device chips, such spatial variations can even be observed between one location and another of the same semiconductor device chip. When the shunted inverter 10 has the same dimensions as the output inverters INV_N and INV_P, is fabricated by the same process, and is disposed within the semiconductor device chip near the output inverters INV_N and INV_P, the shunted inverter 10 and the two output inverters are affected in the same way by the spatially dependent variations in the fabrication process. In addition, when the shunted inverter 10 and the two output inverters INV_N and INV_P are provided in the same region of the semiconductor device chip, the operation of the shunted inverter and the two output inverters is affected by variations in the power supply voltage level and temperature that exist within that particular region of the semiconductor device chip. As a result, variations in the power supply voltage level and temperature affect all three inverters to approximately the same extent, causing the three inverters simultaneously to experience changes in their quiescent points to approximately the same extent and direction.

Figure 2:
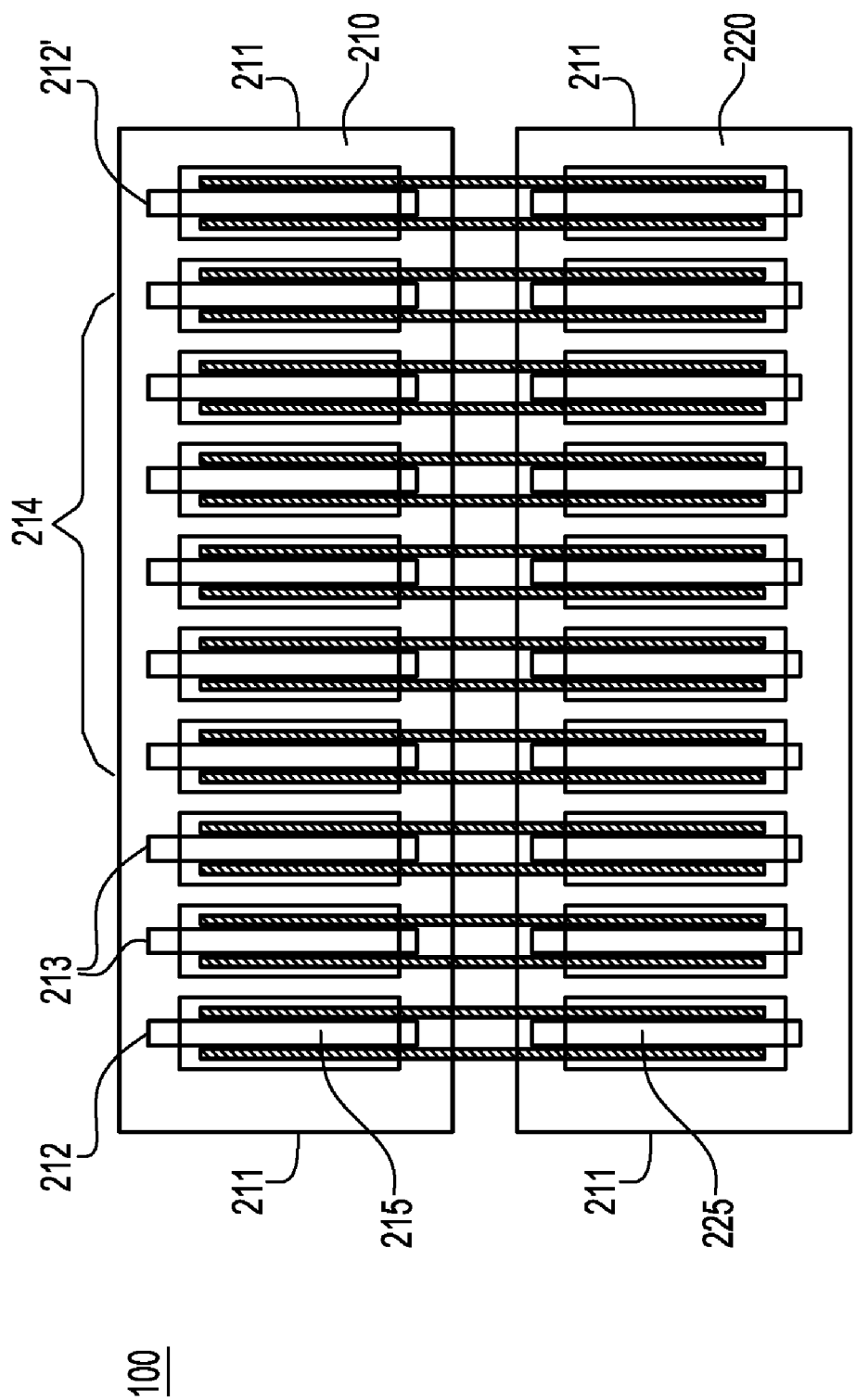
FIG. 2 is a top-down plan view illustrating a layout of devices used to implement the clock signal converter illustrated in FIG. 1, in accordance with an embodiment of the invention.

FIG. 2 is a top-down plan view illustrating an exemplary layout of inverters included in the signal regenerator 100 in accordance with a preferred embodiment of the invention. As shown therein, each inverter is disposed in a column including a PFET 215 disposed in an n-well 210 and an NFET 225 disposed in a p-well 220, these devices of the inverter extending from the top of the figure to the bottom. In a particular example, two dummy inverters 212 and 212' are disposed in columns at outside edges 211 of the n-well and the p-well. The shunted inverter 213 (representing INV_R shown in FIG. 1) is formed by the combination of two sets of a PFET and NFET. In addition, other columns 214 of PFETs and NFETs shown in FIG. 2 make up the inverters INV_N and INV_P (FIG. 1) of the output stage. As illustrated in FIG. 2, the columns 213 of PFETs and NFETS which make up the shunted inverter INV_R preferably are disposed adjacent to (side-by-side with) the columns 214 of PFETs and NFETs which make up the output inverters INV_N and INV_P, with no other semiconductor devices between the devices 213 of the shunted inverter and the devices 214 of the output inverters.

Figure 3:
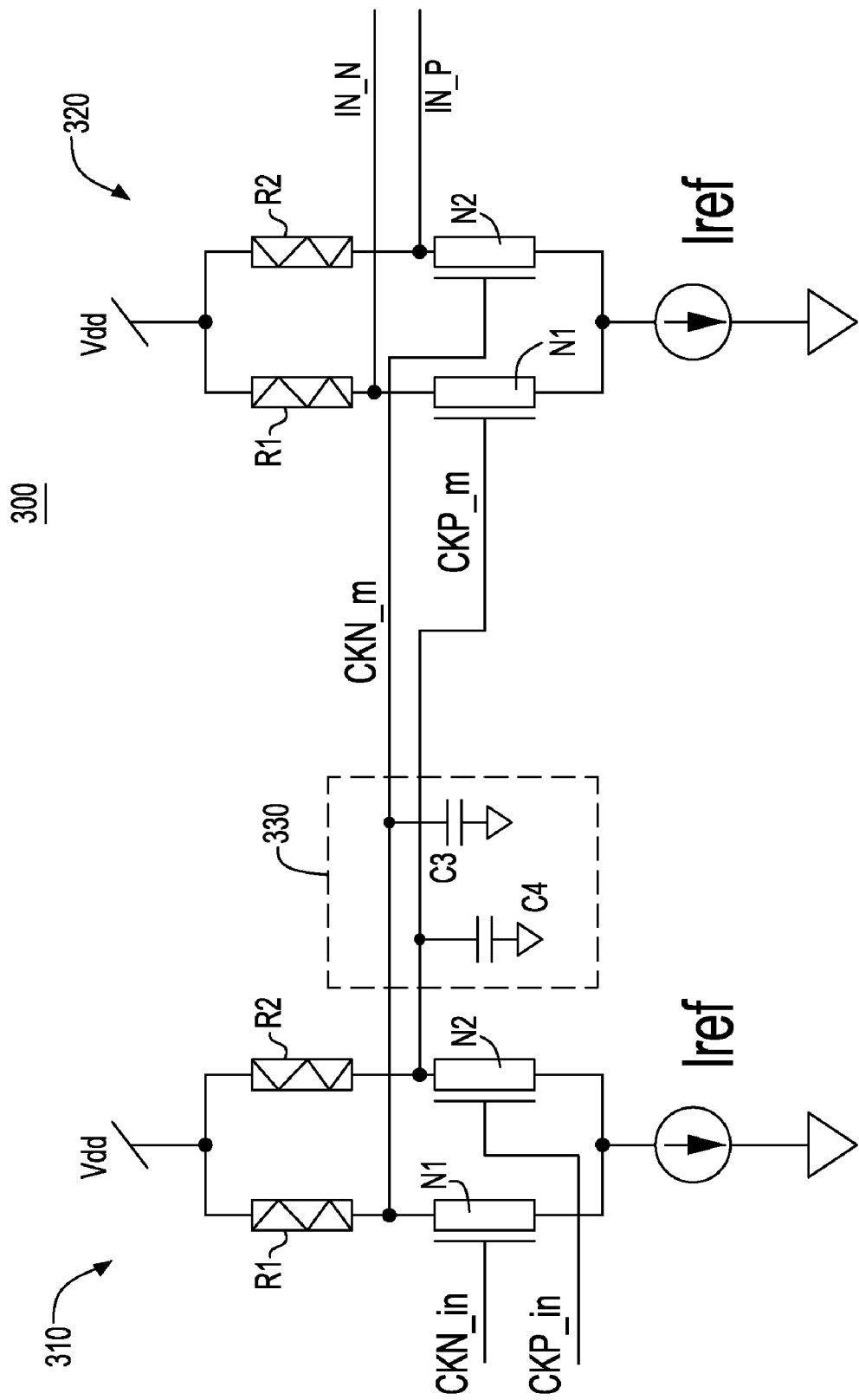
FIG. 3 is a schematic diagram illustrating an input signal stage of the clock signal converter circuit in accordance with an embodiment of the invention.

A more detailed view of an exemplary input stage 300, corresponding to the input stage 20 (FIG. 1) is illustrated in FIG. 3. As shown therein, the input stage 300 includes two differential amplifiers 310, 320. The differential signal outputs CKN_m and CKP_m of the first differential amplifier are input to the second differential amplifier 320, which then outputs the regenerated differential signals IN_N and IN_P.

Each differential amplifier is driven by a current source $I_{ref}$, and typically is mirrored from the same primary current source so as to maintain a consistent level. Each differential amplifier has a first leg including an n-type conduction channel pull-down transistor N1 and resistance R1, and a second leg including a second n-type conduction channel pull-down transistor N2 and resistance R2. Each of the resistances R1 and R2 preferably has the same value. Each of the differential amplifiers 310, 320 operates to regenerate the differential clock signal inputted thereto. Specifically, with respect to differential amplifier 310, when the CKN_in signal is higher than the CKP_in signal at one moment in time, transistor N1 conducts more current than transistor N2, causing the voltage of the output signal CKN_m to be pulled lower (by the voltage drop across R1) than the voltage of the CKP_m output signal. On the other hand, when the CKP_in signal is higher than the CKN_in signal at a moment in time, transistor N2 conducts more current than transistor N1, causing the voltage of the output signal CKN_m to be pulled lower than the voltage of the CKP_m output signal.

The CKN_m and CKP_m signals operate as intermediate signals within the output stage 300, being supplied as inputs to the second differential amplifier 320. When the clock signal needs to be supplied to multiple locations within the region of the semiconductor device chip that it serves, these intermediate signals can be fanned out to multiple instances of the second differential amplifier 320 at different specific locations within the particular region of the chip. The effects of parasitic capacitance upon these signals are shown in lumped form as capacitances C3 and C4 in fan-out block 330 of the diagram.

Figure 4:
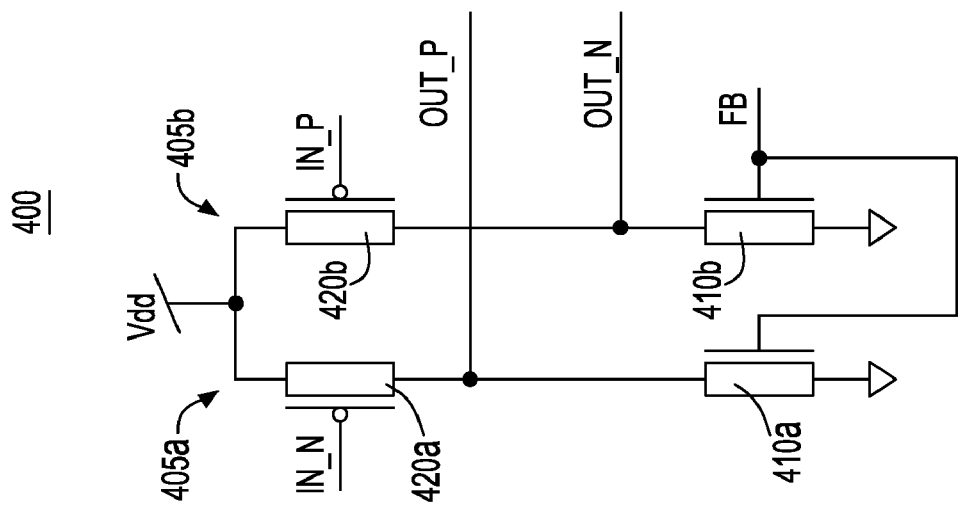
FIG. 4 is a schematic diagram illustrating an exemplary circuit for implementing a feedback control block of the clock signal converter in accordance with an embodiment of the invention.

Referring again to FIG. 1, the signal converter 120 further includes a feedback control block 30. The feedback control block receives a regenerated differential clock signal pair 70 in form of the differential clock signals IN_N and IN_P. FIG. 4 is a schematic diagram illustrating an exemplary feedback control block 400 for implementing the feedback control block 30 (FIG. 1). The feedback control block 400 operates to further condition the differential signal received as inputs IN_N and IN_P from the input stage 300 of the signal regenerator. The feedback control block outputs level-adjusted signals OUT_P and OUT_N which are symmetric about a common mode signal level which is established by the application of the COM_P reference voltage level to the center node 35 of the voltage divider 36. To maintain this relationship, the feedback control block 400 receives a feedback control signal FB from the high gain differential amplifier 40 through low-pass filter 50 (FIG. 1).

The feedback control block 400 has two legs 405a, 405b, each leg providing a separate conduction path between Vdd and ground. As shown in FIG. 4, each leg of the feedback control block includes a PFET and an NFET coupled between the power supply voltage Vdd and ground. Leg 405a includes PFET 420a and NFET 410a, and leg 405b includes PFET 420b and NFET 410b. The feedback control signal FB is provided to the gates of both of the NFETs to control the amount of current drawn by each leg to control the levels of the output signals OUT_N and OUT_P. When the feedback control signal is increased, the NFETs 410a, 410b draw more current through the respective legs 405a, 405b of the circuit, causing the output signals OUT_P and OUT_N to become lower. When the feedback control signal is decreased, the NFETs 410a, 410b draw less current through the respective legs 405a, 405b of the circuit, causing the output signals OUT_P and OUT_N to become higher. In this way, the feedback control block FB uses the feedback control signal FB to maintain the symmetry of the signals OUT_P and OUT_N about the common mode signal level (COM_P).

Figure 5:
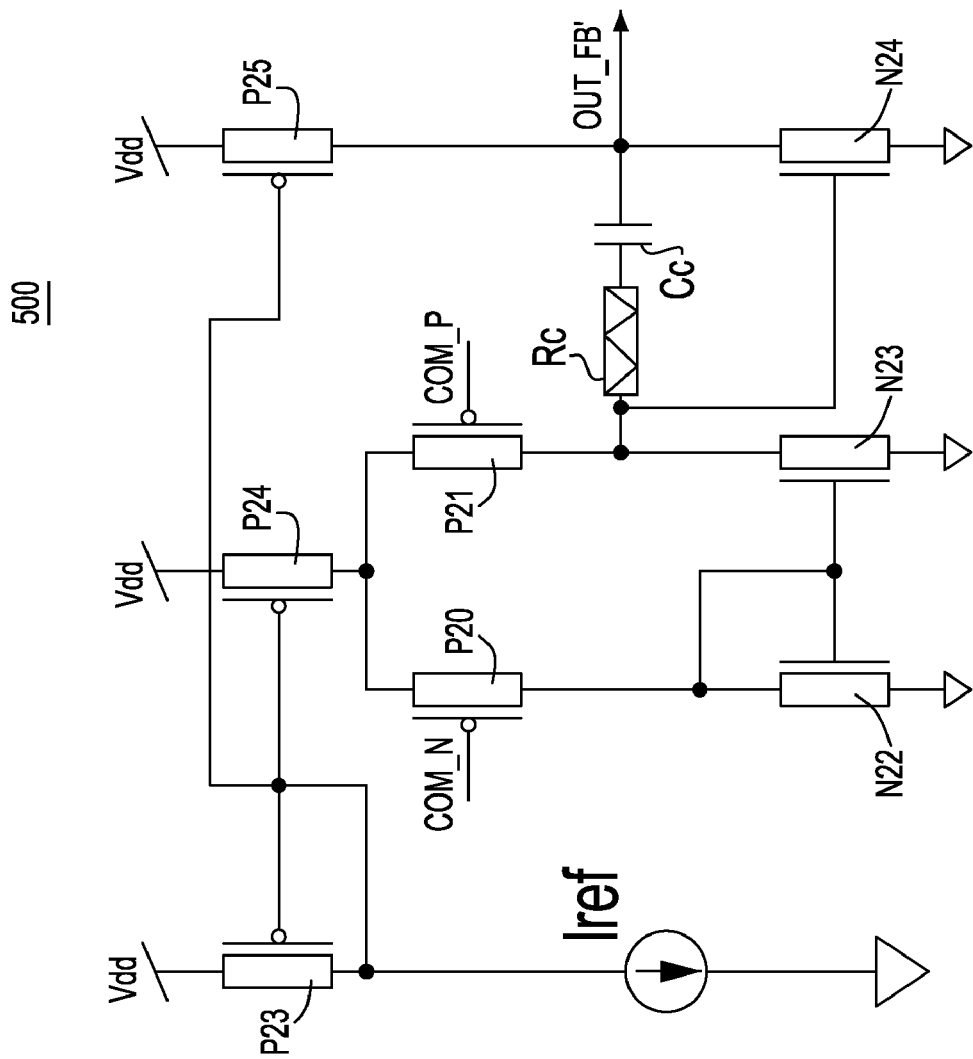
FIG. 5 is a schematic diagram illustrating an exemplary circuit for implementing a differential amplifier of the clock signal converter in accordance with an embodiment of the invention.

An exemplary circuit 500 for implementing the differential amplifier 40 (FIG. 1) is illustrated in FIG. 5. The differential amplifier circuit 500 includes a two-stage amplifier, which includes, in a first stage, PFET input transistors P20 and P21, to which the COM_N and COM_P voltage levels are input, and pull-down transistors N22 and N23. Transistor N22 is connected in a diode configuration, its drain and gate terminals shorted together. The gate of transistor N23 is connected to the gate of N22 such that the gate bias on transistor N23 is maintained the same on both transistors.

PFETs P24 and P25 supply constant amounts of current to the first stage through PFET P24 and to the second through P25, the current in each stage being mirrored from a constant reference current $I_{ref}$ which flows through PFET P23. Resistor Rc and capacitor Cc serve as a compensation network to ensure that the phase margin of the differential amplifier 500 adequately safeguards against ringing. The transistor biasing points and values of Rc and Cc are set preferably at values for achieving phase margins between about 65 degrees and 82 degrees. The differential amplifier circuit 500 provides a feedback output OUT_FB' which, after conditioning via the low-pass filter circuit 50 (FIG. 1), is supplied as the feedback control signal FB to the feedback control block 30 (FIG. 1).

The conditioned output FB (FIG. 1) obtained by filtering the output OUT_FB' of the differential amplifier circuit 500 is used by the feedback control block 40 to maintain the COM_P voltage level at about the same voltage level as the COM_N voltage level. The return path of the feedback loop to the differential amplifier 500 is completed by the COM_P voltage level that is present at the center tap of the voltage divider 36. The differential amplifier circuit 500 operates as follows. When the voltage level of COM_P is lower than COM_N, PFET P21 will be turned on to a greater extent than PFET P20, such that the voltage of the feedback output OUT_FB' is pulled lower. In turn, the feedback control signal FB supplied to the feedback control block 400 is lowered. In the feedback control block, the lower value FB signal causes NFETs 410a and 410b to be turned on to a lesser extent, which, in turn, causes the signal levels of the output signals OUT_P and OUT_N to move higher.

A signal regenerator 100 (FIG. 1) is described herein in accordance with certain preferred embodiments of the invention. The differential amplifier circuit 500 has high gain and phase margin maintained within a desirable range, and the common mode reference voltage generator 10 utilizes a shunted inverter 10 that is affected in a similar manner by variations in the fabrication process, power supply voltage and temperature that affect the output inverters INV_N and INV_P of the circuit. With these features, the signal regenerator 100 is capable of maintaining the duty cycle of the final outputted rail-to-rail signals CKN_out and CKP_out between about 47% and 53%. Moreover, such duty cycle is achieved while the area occupied by the signal regenerator 100 remains relatively small.

While the invention has been described in accordance with certain preferred embodiments thereof, many modifications and enhancements can be made thereto without departing from the true scope and spirit of the invention, which is limited only by the claims appended below.

What is claimed is:

1. A method of converting a differentially transmitted signal to a single-ended rail-to-rail output signal, comprising:
generating a common mode reference voltage level which varies in relation to at least one of a process used to fabricate a generator of said common mode reference voltage level, a level of a power supply voltage provided to said common mode reference level generator or a temperature at which said common mode reference level generator is operated, said step of generating including applying the output of a first inverter back to an input of the first inverter;
receiving a differentially transmitted signal pair including a first input signal and a second input signal;
outputting a single-ended output signal representing information carried by the differentially transmitted signal pair using a second inverter to establish an upper rail voltage level and a lower rail voltage level of the single-ended output signal; and
controlling a common mode level of the first single-ended output signal in accordance with the common mode reference voltage level,
wherein the first inverter tracks variability of the at least one of a process used to fabricate, a power supply voltage or a temperature of the first inverter in a manner representative of variability of a process used to fabricate, a power supply voltage or a temperature of the second inverter.

2. The method as claimed in claim 1, wherein the common mode reference voltage level determines a switching point at which said single-ended output signal switches between a low output voltage level and a high output voltage level.

3. The method as claimed in claim 1, further comprising applying the common made reference voltage level to an intermediate node of a voltage divider to establish a predetermined relationship between the upper rail voltage level and the lower rail voltage level.

4. The method as claimed in claim 3, wherein the common mode reference voltage level establishes a voltage halfway between the upper rail voltage level and the lower rail voltage level.

5. The method as claimed in claim 1, wherein a duty cycle of the single-ended output signal is determined by the common mode reference voltage level.

6. The method as claimed in claim 1, wherein the single-ended output signal is a first single-ended output signal and the step of outputting the single-ended output signal further includes outputting a second rail-to-rail output signal which varies between the lower rail voltage level and the upper rail voltage level, wherein the first and second rail-to-rail output signals are complementary.

7. The method as claimed in claim 2, wherein the first and second input signals are input in accordance with a current mode logic ("CML") signaling protocol and the output signal is output in accordance with a complementary metal oxide semiconductor ("CMOS") signaling protocol.

* * * * *